United States Patent
Han et al.

(10) Patent No.: US 8,575,593 B2
(45) Date of Patent: Nov. 5, 2013

(54) SEMICONDUCTOR LIGHT EMITTING DEVICE AND FABRICATION METHOD THEREOF

(75) Inventors: Sang Heon Han, Gyeonggi-do (KR); Jong Hyun Lee, Seoul (KR); Jin Young Lim, Gyeonggi-do (KR); Dong Ju Lee, Gyeonggi-do (KR); Heon Ho Lee, Gyeonggi-do (KR); Young Sun Kim, Gyeonggi-do (KR); Sung Tae Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/557,915

(22) Filed: Jul. 25, 2012

(65) Prior Publication Data
US 2013/0026446 A1 Jan. 31, 2013

(30) Foreign Application Priority Data
Jul. 25, 2011 (KR) .......................... 10-2011-0073529

(51) Int. Cl.
*H01L 33/32* (2010.01)
(52) U.S. Cl.
USPC 257/14; 257/13; 257/E33.033; 257/E33.034; 438/37; 438/47
(58) Field of Classification Search
USPC ................ 257/13, 14, 15, E33.033, E33.034; 438/46
See application file for complete search history.

(56) References Cited

U.S. PATENT DOCUMENTS

| | | | | |
|---|---|---|---|---|
| 6,936,838 B2* | 8/2005 | Kim | ................................ | 257/14 |
| 7,772,588 B1* | 8/2010 | Lee et al. | ........................ | 257/13 |
| 8,008,647 B2* | 8/2011 | Park et al. | ....................... | 257/13 |
| 2005/0199903 A1* | 9/2005 | Kyono et al. | .................. | 257/103 |
| 2008/0023689 A1* | 1/2008 | Kim et al. | ........................ | 257/13 |
| 2009/0224226 A1* | 9/2009 | Huang et al. | .................... | 257/13 |
| 2009/0238227 A1* | 9/2009 | Kubota et al. | ............ | 372/45.011 |

FOREIGN PATENT DOCUMENTS

| | | |
|---|---|---|
| JP | 11-008406 A | 1/1999 |
| JP | 2003-234545 A | 8/2003 |
| KR | 100482511 B1 | 4/2005 |

* cited by examiner

*Primary Examiner* — Matthew W Such
*Assistant Examiner* — Stephen Bradley
(74) *Attorney, Agent, or Firm* — McDermott Will & Emery LLP (57) ABSTRACT

A semiconductor light emitting device and a fabrication method thereof are provided. The semiconductor light emitting device includes: first and second conductivity-type semiconductor layers; and an active layer disposed between the first and second conductivity-type semiconductor layers and having a structure in which a quantum barrier layer and a quantum well layer are alternately disposed, and the quantum barrier layer includes first and second regions disposed in order of proximity to the first conductivity-type semiconductor layer.

22 Claims, 8 Drawing Sheets

SEMICONDUCTOR LIGHT EMITTING DEVICE AND FABRICATION METHOD THEREOF

CROSS-REFERENCE TO RELATED APPLICATIONS

This application claims the priority of Korean Patent Application No. 10-2011-0073529 filed on Jul. 25, 2011, in the Korean Intellectual Property Office, the disclosure of which is incorporated herein by reference.

BACKGROUND OF THE INVENTION

1. Field of the Invention

The present invention relates to a semiconductor light emitting device and a fabrication method thereof.

2. Description of the Related Art

A light emitting diode, a type of semiconductor light emitting device, is a semiconductor device capable of generating light of various colors according to electron hole recombination in p and n type semiconductor junctions when current is applied thereto. Compared with a filament-based light emitting device, a semiconductor light emitting device has various advantages such as a long lifespan, low power consumption, excellent initial driving characteristics, and the like, and accordingly, demand for semiconductor light emitting devices has continued to grow. In particular, recently, a group III-nitride semiconductor capable of emitting short-wavelength blue light has come to prominence.

As nitride semiconductor light emitting devices have made remarkable progress since first being developed, the utilization thereof has been greatly expanded and research into utilizing semiconductor light emitting devices for the purpose of general illumination, as well as for electric device light sources, has been actively undertaken. In particular, related art nitride light emitting devices have largely been used as components of low-current/low output mobile products, and recently, the utilization of nitride light emitting devices has extended into the field of high current/high output devices.

Meanwhile, in the case of a nitride semiconductor grown in a polarity direction, a strong field is applied to the interior of an active layer due to polarization. Thus, wave functions of electrons and holes in the active layer are spatially separated according to the generated internal field, degrading recombination probability. Thus, a method for improving internal quantum efficiency by minimizing a polarization effect is required in the art to which the present invention pertains.

SUMMARY OF THE INVENTION

An aspect of the present invention provides a semiconductor light emitting device in which crystallinity and internal quantum efficiency are enhanced while an influence of polarization is minimized through appropriately adjusting the shape of a band gap of a quantum barrier layer and appropriately adjusting a content of indium (In).

According to an aspect of the present invention, there is provided a semiconductor light emitting device including: first and second conductivity-type semiconductor layers; and an active layer disposed between the first and second conductivity-type semiconductor layers and having a structure in which a quantum barrier layer and a quantum well layer are alternately disposed, wherein the quantum well layer is made of $In_xGa_{(1-x)}N$ ($0<x\leq1$) and the quantum barrier layer is made of $Al_yIn_zGa_{(1-y-z)}N$ ($0\leq y\leq1$, $0\leq z<1$), and the quantum barrier layer includes first and second regions disposed in order of proximity to the first conductivity-type semiconductor layer, wherein, in the first region, the content of indium (In) is reduced through a first slope in a direction in which the second conductivity-type semiconductor layer is disposed and, in the second region, the content of indium (In) is increased through a second slope in a direction in which the second conductivity-type semiconductor layer is disposed.

The first and second regions may be in contact with each other.

A region in which the first and second regions are in contact of the quantum barrier layer may be made of GaN.

Absolute values of the first and second slopes may be equal.

A region between the first and second regions in the quantum barrier layer may be made of GaN.

The region between the first and second regions in the quantum barrier layer may be made of $Al_yGa_{(1-y)}N$.

The quantum barrier layer may further include an intermediate region interposed between the first and second regions and having uniform band gap energy.

The intermediate region may have a thickness ranging from 1 to 50 Å.

The intermediate region may be made of GaN or $Al_yGa_{(1-y)}N$.

A region of the quantum barrier layer forming an interface with at least the quantum well layer may be made of a material having a composition in which an amount of z is less than or equal to 0.10.

In the quantum barrier layer, a band gap shape may be symmetrical based on the center between the first and second regions.

The quantum barrier layer may include third and fourth regions interposed between the first and second regions and disposed in order toward the first conductivity-type semiconductor layer, wherein, in the third region, the content of indium (In) may be reduced through a third slope, different from the first slope, in a direction in which the second conductivity-type semiconductor layer is disposed (or toward the second conductivity-type semiconductor layer), and in the fourth region, the content of indium (In) may be increased through a fourth slope, different from the second slope, in the direction in which the second conductivity-type semiconductor layer is disposed.

The quantum well layer may include a region in which the content of indium (In) is changed through a slope toward the quantum barrier layer.

An absolute value of the slope through which the content of indium (In) in the quantum well layer may be greater than those of the first and second slopes.

The active layer may have a step structure formed in at least one of regions between the quantum well layer and the quantum barrier layer and having less band gap energy than that of an adjacent quantum barrier layer.

According to another aspect of the present invention, there is provided a method for fabricating a semiconductor light emitting device, including: forming a first conductivity-type semiconductor layer on a substrate; forming an active layer having a structure in which a quantum barrier layer and a quantum well layer are alternately disposed, on the first conductivity-type semiconductor layer; and forming a second conductivity-type semiconductor layer on the active layer, wherein the quantum well layer is made of $In_xGa_{(1-x)}N$ ($0<x\leq1$) and the quantum barrier layer is made of $Al_yIn_zGa_{(1-y-z)}N$ ($0\leq y\leq1$, $0\leq z<1$), and the quantum barrier layer includes first and second regions disposed in order of proximity to the first conductivity-type semiconductor layer, wherein, in the first region, the content of indium (In) is reduced through a first slope in a direction in which the second conductivity-type semiconductor layer is disposed and, in the second region, the content of indium (In) is increased through a second slope in a direction in which the second conductivity-type semiconductor layer is disposed.

The first region may be formed by gradually increasing a growth temperature of the quantum barrier layer.

The second region may be formed by gradually decreasing the growth temperature of the quantum barrier layer.

A growth temperature of a region having the highest content of indium (In) in the first region may range from 650° C. to 900° C.

A growth temperature of a region having the lowest content of indium (In) in the first region may range from 700° C. to 1,200° C.

The content of indium (In) of the first and second regions may be adjusted by changing a supply amount of an indium (In) source gas.

The quantum barrier layer may be made of a compound including aluminum (Al), and the content of aluminum (Al) of the quantum barrier layer may be adjusted by changing a supply amount of an aluminum (Al) source gas.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 1:
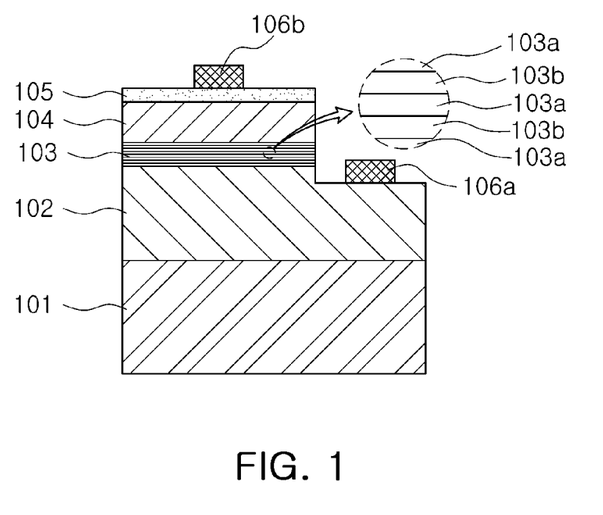
FIG. 1 is a schematic cross-sectional view of a semiconductor light emitting device according to an embodiment of the present invention.
Figure 2:
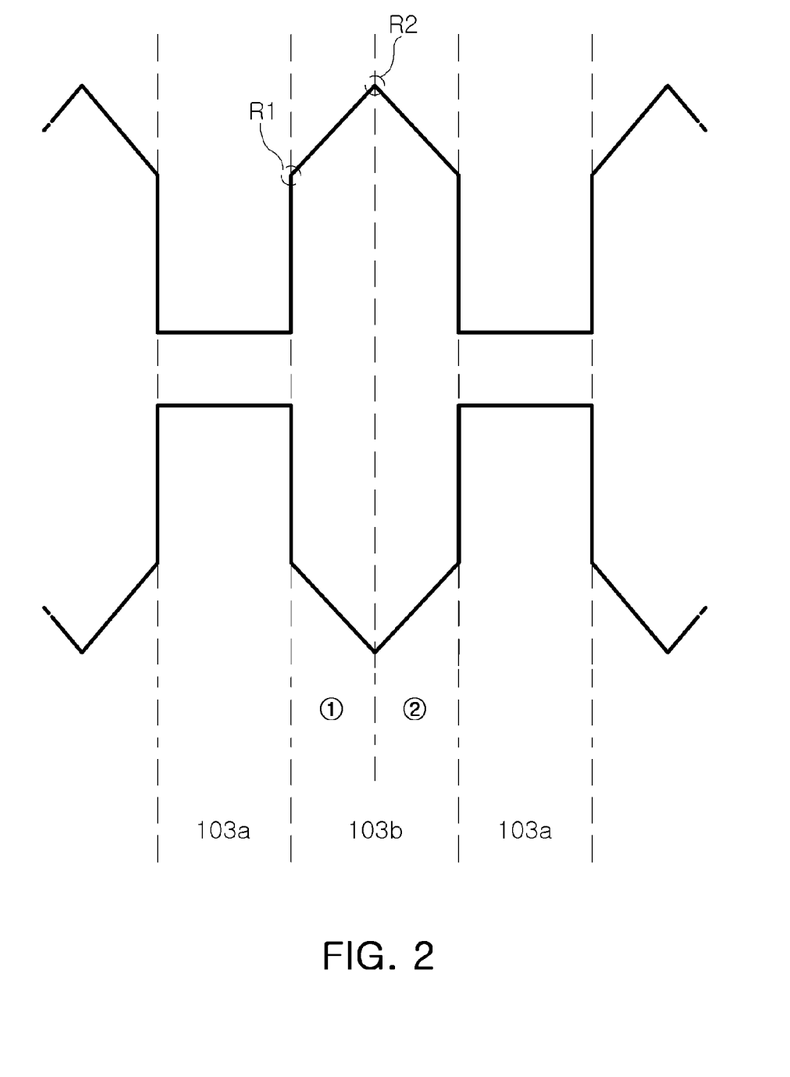
FIG. 2 is an energy band diagram around an active layer that can be employed in the semiconductor light emitting device of FIG. 1.

FIG. 1 is a schematic cross-sectional view of a semiconductor light emitting device according to an embodiment of the present invention. FIG. 2 is an energy band diagram around an active layer that can be employed in the semiconductor light emitting device of FIG. 1. With reference to FIG. 1, a semiconductor light emitting device 100 according to the present embodiment includes a substrate 101, a first conductivity-type semiconductor layer 102, an active layer 103, a second conductivity-type semiconductor layer 104, and an ohmic-electrode layer 105. First and second electrodes 106a and 106b are formed on upper surfaces of the first conductivity-type semiconductor layer 102 and the ohmic-electrode layer 105, respectively. Here, the terms 'upper portion', 'upper surface', 'lower portion', 'lower surface', 'lateral surface', or the like, are used based on the directionality of the drawings, which may be changed according to the direction in which the device is actually disposed in use.

The substrate 101 is a semiconductor growth substrate. As the substrate 101, a substrate made of an insulating, conductive, or semiconductive material such as sapphire, Si, SiC, $MgAl_2O_4$, MgO, $LiAlO_2$, $LiGaO_2$, GaN, or the like, may be used. In this case, sapphire having electrical insulation characteristics may most preferably be used. Sapphire is a crystal having Hexa-Rhombo R3c symmetry, of which lattice constants in c-axis and a-axis directions are 13.001 Å and 4.758 Å, respectively. A sapphire crystal has a C (0001) face, an A (1120) face, an R (1102) face, and the like. In this case, a nitride thin film can be relatively easily formed on the C face of the sapphire crystal, and because sapphire crystal is stable at high temperatures, it is commonly used as a material for a nitride growth substrate. Here, however, when the nitride thin film is grown from the C face, a strong electric field may be formed in the nitride thin film due to a piezoelectric effect. Meanwhile, a silicon (Si) substrate may be appropriately used as the substrate 101, and mass-production can be facilitated by using the silicon (Si) substrate which may have a large diameter and be relatively low priced. When the silicon (Si) substrate is used, a nucleation layer made of a material such as $Al_xGa_{1-x}N$ may be formed on the substrate 101 and a nitride semiconductor having a desired structure may be grown on the nucleation layer.

The first and second conductivity-type semiconductor layers 102 and 104 may be semiconductor layers doped with n-type and p-type impurities, respectively, but the present invention is not limited thereto. Conversely, the first and second conductivity-type semiconductor layers 102 and 104 may be p-type and n-type semiconductor layers, respectively. Also, the first and second conductivity-type semiconductor layers 102 and 104 may be made of a nitride semiconductor, e.g., a material having a composition of $Al_xIn_yGa_{1-x-y}N$ ($0 \leq x \leq 1$, $0 \leq y \leq 1$, $0 \leq x+y \leq 1$). The active layer 103, disposed between the first and second conductivity-type semiconductor layers 102 and 104, emits light having a certain energy level, according to the recombination of electrons and holes and may have a multi-quantum well (MQW) structure in which quantum well layers 103a and quantum barrier layers 103b are alternately stacked, and here, in the case of the nitride semiconductor, the quantum well layers 103a may be made of InGaN (the content of In and Ga may be variable) and the quantum barrier layers 103b may include regions made of GaN, InGaN (the content of In and Ga may be variable and the content of In may be less than that of the quantum well layers), and AlInGaN (the content of Al, In, and Ga may be variable).

In detail, the quantum well layer 103a may be made of $In_xGa_{(1-x)}N$ ($0<x\leq1$), and the quantum barrier layer 103b may be made of $Al_yIn_zGa_{(1-y-z)}N$ ($0\leq y\leq1$, $0\leq z<1$). In the present embodiment, the quantum barrier layers 103b have a band gap energy structure and a composition through which an influence of polarization charges is minimized and crystallinity is enhanced, details thereof will be described later. Meanwhile, the first and second conductivity-type semiconductor layers 102 and 104 and the active layer 103 constituting the light emitting structure may be grown by using a process known in the art, such as metal organic chemical vapor deposition (MOCVD), hydride vapor phase epitaxy (HVPE), molecular beam epitaxy (MBE), and the like.

The ohmic-electrode layer 105 may be made of a material that exhibits electrical ohmic-characteristics with the second conductivity-type semiconductor layer 104. The ohmic-electrode layer 105 may be formed of a transparent conductive oxide such as ITO, CIO, ZnO, or the like, that has a high level of light transmittance and relatively excellent ohmic-contact performance among materials used for a transparent electrode. Alternatively, the ohmic-electrode layer 105 may be made of a light-reflective material, e.g., a highly reflective metal, and in this case, the device 100 may be used in a so-called flip-chip structure mounted toward a lead frame, or the like, of the first and second electrode 106a, 106b package. Here, the ohmic-electrode layer 109 may not be essential in the present embodiment and may be excluded according to varying circumstances.

The first and second electrodes 106a and 106b may be made of a material having electrical conductivity known in the art. For example, the first and second electrodes 106a and 106b may be formed by depositing, sputtering, or the like, one or more of silver (Ag), aluminum (Al), nickel (Ni), chromium (Cr), and the like. In the structure illustrated in FIG. 1, the first and second electrodes 106a and 106b are formed on the first conductivity-type semiconductor layer 102 and the ohmic-electrode layer 105, respectively, but such an electrode (106a, 106b) formation scheme is merely an example, and electrodes may be formed in various positions on the light emitting structure including the first conductivity-type semiconductor layer 102, the active layer 103, and the second conductivity-type semiconductor layer 104.

In the present embodiment, the quantum barrier layer 103b is made of $Al_yIn_zGa_{(1-y-z)}N$ ($0\leq y\leq1$, $0\leq z<1$), and includes first and second regions ① and ② disposed in order of proximity to the first conductivity-type semiconductor layer 102. In this case, the content of indium (In) in the first region ① is reduced through a first slope toward the second conductivity-type semiconductor layer 104, and accordingly, as illustrated in FIG. 2, band gap energy of the first region ① is increased with a slope. Also, the content of indium (In) in the second region ② is increased through a second slope in a direction in which the second conductivity-type semiconductor layer 104 is disposed (i.e. toward the second conductivity-type semiconductor layer 104), and accordingly, band gap energy of the second region ② is reduced with a slope. Here, the direction in which the second conductivity-type semiconductor layer is disposed refers to an upward direction based on FIG. 1, which corresponds to a rightward direction based on FIG. 2. In this case, absolute values of the first and second slopes may be identical or may be different according to process conditions or as necessary.

The first and second regions ① and ② may be disposed to be in contact, and accordingly, as shown in FIG. 2, a region in which band gap energy peaks appears between the first and second regions ① and ②. Also, the quantum barrier layer 103b may be formed such that the band gap shape is symmetrical based on a centerline between the first and second regions ① and ②. However, the present invention is not limited thereto and the quantum barrier layer 103b may have an asymmetric band gap shape according to an embodiment, and the following embodiment is no different.

Figure 3:
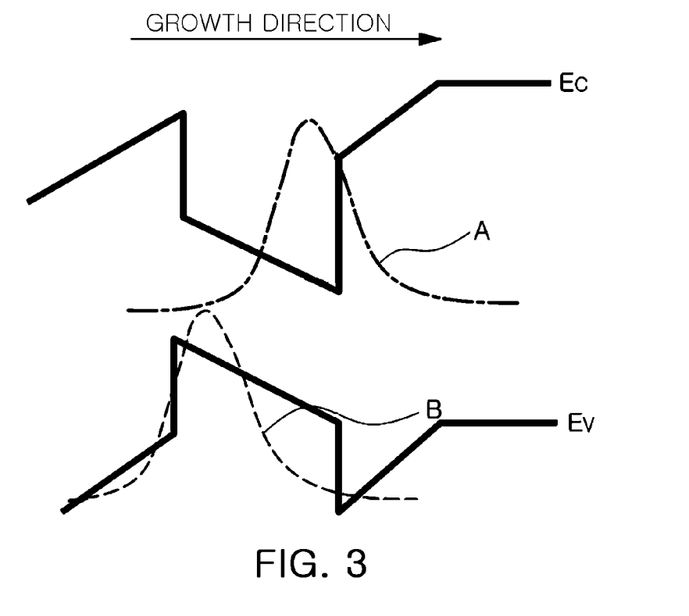
FIG. 3 is a view showing a band gap diagram along with a wave function of a carrier in a related art active layer.
Figure 4:
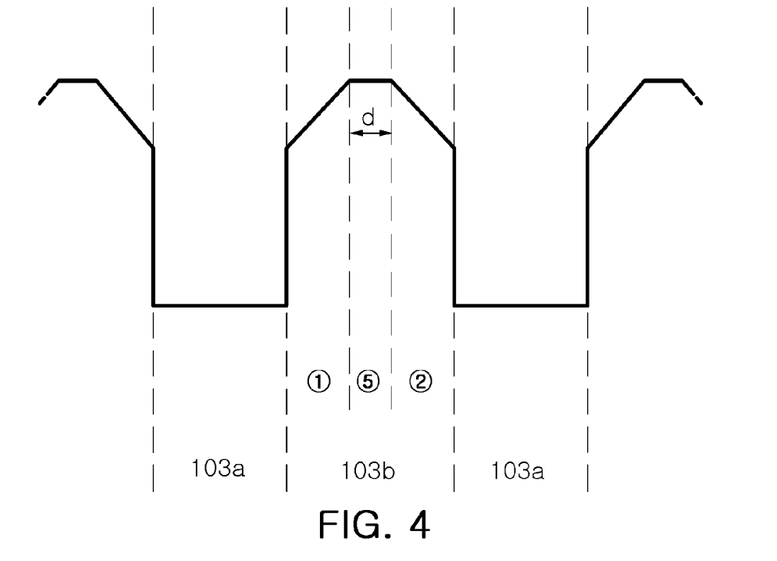
FIGS. 4 through 8 are variants of energy band diagrams around an active layer that can be employed in the semiconductor light emitting device of FIG. 1, respectively.

In the present embodiment, when the quantum barrier layer 103b is made of a nitride including indium (In), a piezoelectric effect on the interface between the quantum barrier layer 103b and the quantum well layer 103a made of $In_xGa_{(1-x)}N$ ($0<x\leq1$). This will be described in detail. FIG. 3 is a view showing a band gap diagram along with a wave function of a carrier in a related art active layer. In the case of a nitride semiconductor grown from a polarity plane such as C plane, or the like, of the sapphire substrate, polarization charges are generated therein, and in particular, a large internal field is induced by polarization charges at the interface between heterogeneous materials having a great difference in energy levels. Thus, as shown in FIG. 3, the highest point of the wave function A representing the distribution of electrons appears to be slanted to the a p type nitride semiconductor layer, and a wave function B of holes appears to be slanted to an n type nitride layer. In this manner, since the wave function A of electrons and the wave function B of holes are positioned at opposite sides of the quantum well layer, electron hole emission recombination efficiency is reduced due to the characteristics that the electron hole emission recombination efficiency is proportional to an area in which the two wave functions overlap, and as a result, the amount of luminescence is also reduced. Such a wave function separation phenomenon is salient when the band gap energy of the well layer is uniformly maintained. In the present embodiment, since the quantum barrier layer 103b is made of a nitride including indium (In), a difference in band gap energy between the quantum barrier layer 130b and the quantum well layer 103a made of $In_xGa_{(1-x)}N$ ($0<x\leq1$) can be reduced in comparison to GaN, AlGaN, and the like. Also, since a region in which the band gap energy is uniformly maintained is minimized, a polarization effect in the active layer 103 can be reduced.

In consideration of a carrier confinement effect, and the like, as well as the polarization reduction, it is necessary to appropriately set the content of indium (In) of the quantum barrier layer 103b. Specifically, a region R1 of the quantum barrier layer 103b forming an interface with the quantum well layer 103a may be made of a material having a composition in which the content of indium is about 10% or less, namely, an amount of z in $Al_yIn_zGa_{(1-y-z)}N$ is less than or equal to 0.10. Also, as mentioned above, the first region ① of the quantum barrier layer 103b has the content of indium (In) gradually reduced (while the band gap energy is increased) toward the second conductivity-type semiconductor layer, and a region R2 in which the first and second regions ① and ② are in contact may be made of a material not including indium (In), e.g., GaN. In this case, the region R2 in which the first and second regions ① and ② are in contact and a peripheral region thereof may be made of $Al_yGa_{(1-y)}N$ in order to increase the size of the band gap energy to thus increase the carrier confinement effect of the quantum barrier layer 103b. Meanwhile, as described hereinafter, the content of indium (In) may be gradually reduced by increasing a growth temperature of the quantum barrier layer 103b, and conversely, the content of indium (In) may be gradually increased by reducing the growth temperature of the quantum barrier layer 103b. Here, however, the content of indium (In) may not be adjusted only by the growth temperature; it may also be adjusted by other growth conditions, e.g., by changing an injection amount of an indium (In) source gas.

In this manner, the quantum barrier layer 103b may have a region in which the content of indium (In) is changed, specifically, reduced and then increased, enhancing the crystallinity of the quantum barrier layer 103b and carrier confinement effect. In comparison to the case in which the quantum barrier layer 103b is made of $In_{0.05}Ga_{0.95}N$ to reduce a piezoelectric effect (i.e., a case in which there is no change in the band gap energy), the quantum barrier layer 103b according to the present embodiment can be grown at a relatively high temperature in order to reduce the content of indium (In), and such a growth at a high temperature can lead to the enhancement of crystallinity of the quantum barrier layer 103b and layers grown thereon. Namely, the quantum barrier layer 103b made of $In_{0.05}Ga_{0.95}N$ is substantially formed without change in a growth temperature thereof, but in the present embodiment, the quantum barrier layer 103b is grown at a higher temperature to reduce the content of indium (In) having high volatility and enhanced crystallinity. Thus, since the crystallinity of the quantum barrier layer 103b is enhanced, a leakage current of the device 100 is reduced and an efficiency reduction phenomenon under low current density conditions can be overcome. Also, as the content of indium (In) is reduced, the band gap energy of the quantum barrier layer 103b is increased, enhancing the carrier confinement effect and internal quantum efficiency. Also, as mentioned above, in order to further strengthen carrier confinement, at least a portion of the quantum barrier layer 103b may be made of a compound including aluminum (Al). Thus, the use of the quantum barrier layer 103b proposed in the present embodiment can enhance crystallinity and internal quantum efficiency, while minimizing disadvantages due to the piezoelectric effect.

FIGS. 4 through 8 show variants of energy band diagrams around an active layer that can be employed in the semiconductor light emitting device of FIG. 1, respectively, in which an energy level of a conduction band is illustrated. First, in the embodiment of FIG. 4, an intermediate region ⑤ is interposed between the first and second regions ① and ②. It may be difficult to obtain a configuration such as that of the former embodiment in which the first and second regions ① and ② are in contact to make an energy level peak according to fabrication process conditions, so a region, i.e., the intermediate region ⑤ having uniform band gap energy may be provided to have a certain thickness. However, preferably, the intermediate region ⑤ is formed to be as thin as about 1 to 50 Å. The intermediate region ⑤ according to the present embodiment may be applied to all the following embodiments.

Figure 5:
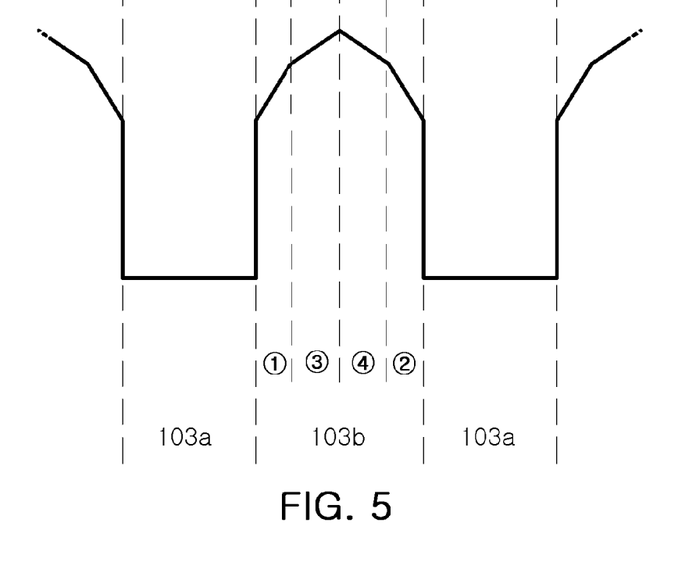
Figure 6:
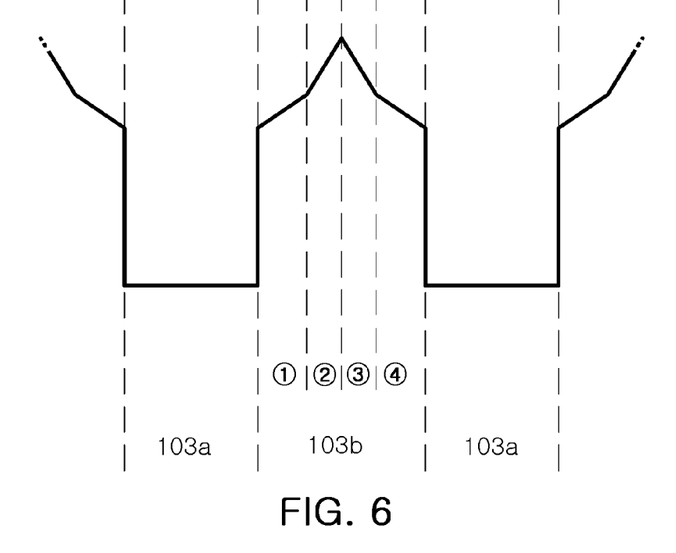

In another example, as shown in FIGS. 5 and 6, unlike the former embodiment, besides the first and second regions ① and ②, the quantum barrier layer 103b further includes third and fourth regions ③ and ④ interposed between the first and second regions ① and ② and disposed in order of proximity to (or disposed sequentially toward) the first conductivity-type semiconductor layer 102. In the third region ③ the content of indium (In) is gradually reduced through a third slope, different from the first slope, toward the second conductivity-type semiconductor layer 104, and accordingly, band gap energy is increased through a slope different from that of the first region ①. Also, the fourth region ④, the content of indium (In) is increased through a fourth slope, different from the second slope, toward the second conductivity-type semiconductor layer 104, and accordingly, the band gap energy is reduced through a slope different from that of the third region ③. In this manner, in the quantum barrier layer 103b, the content of indium (In) may be increased or reduced through two or more different slopes.

In detail, in the example of FIG. 5, the third slope has a smaller absolute value than that of the first slope, and the fourth slope has an absolute value smaller than that of the second slope, and accordingly, carriers may move smoothly. Unlike this case, in the example of FIG. 6, the third slope has an absolute value smaller than that of the first slope and the fourth slope has an absolute value greater than that of the second slope, and accordingly, the carrier confinement effect may be increased. Thus, an appropriate quantum barrier layer among the quantum barrier layers of FIGS. 5 and 6 may be selected, according to the necessity of the degree of confining carriers. The energy level configuration of FIGS. 5 and 6 may be applied to all of the former embodiments and following embodiments.

Figure 7:
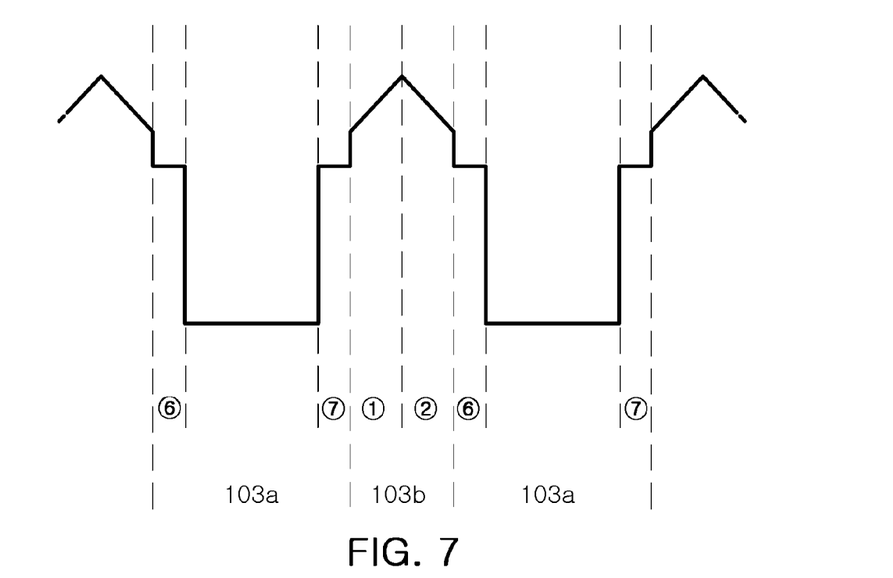

The example of FIG. 7 is obtained by adding the step structures ⑥ and ⑦ to the active layer of FIG. 2. The step structures ⑥ and ⑦ are formed on the interface of the quantum well layer 103a and the quantum barrier layer 103b, and have less band gap energy than that of the adjacent quantum barrier layer 103b. Owing to the step structures ⑥ and ⑦, the efficiency of injecting carriers into the quantum well layer 103a can be further increased. The step structures ⑥ and ⑦ may also be applied to all of the foregoing embodiments and following embodiments.

Figure 8:
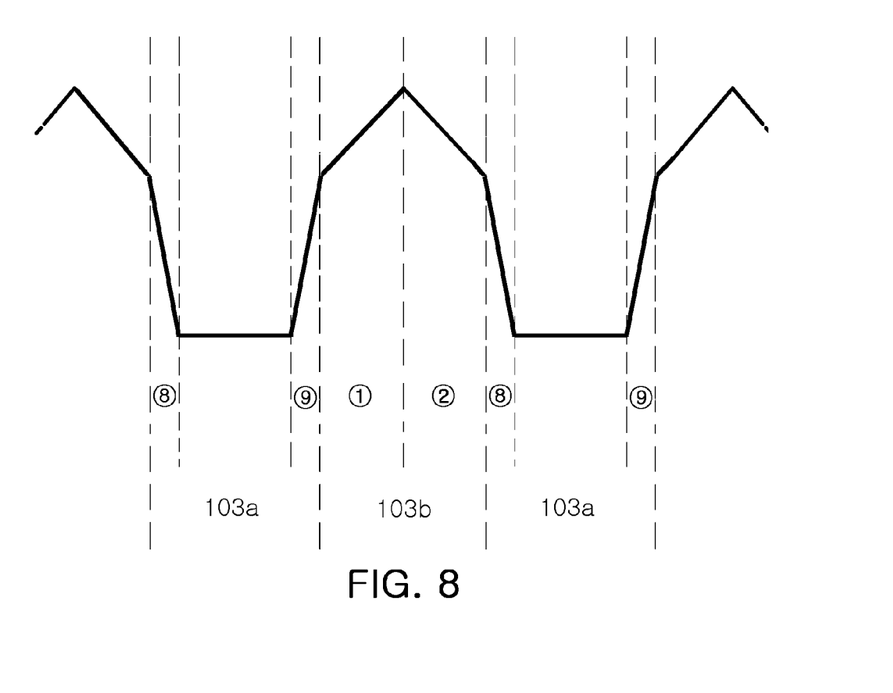

Next, in the example of FIG. 8, the quantum well layer 103a includes regions ⑧ and ⑨ in which the content of indium (In) is changed through a slope in the direction in which the quantum barrier layer 103b is disposed (i.e., the content of indium (In) is changed toward the quantum barrier layer 103b), and the quantum barrier layer 103b has the same shape as that of FIG. 2. In detail, the quantum well layer 103a includes the region ⑧ in which the content of indium (In) is increased through a slope (the band gap energy is reduced) on the interface with the quantum barrier layer 103b adjacent in the direction in which the first conductivity-type semiconductor layer 102 is disposed, and the region ⑨ in which the content of indium (In) is reduced through a slope (the band gap energy is increased) on the interface with the quantum barrier layer 103b adjacent in the direction in which the second conductivity-type semiconductor layer 104 is disposed. In this case, as shown in FIG. 8, the absolute value of the slope through which the content of indium (In) is changed in the quantum well layer 103a may be greater than those of the first and second slopes, and conversely, it may be smaller than the absolute values of the first and second slopes. In this embodiment, the content of indium (In) may not be sharply changed in the interface of the quantum well layer 103a and the quantum barrier layer 103b, further reducing the influence of polarization charges. Meanwhile, the quantum well layer 103a in which the content of indium (In) is changed through a slope may also be applied to all of the foregoing embodiments and following embodiments.

Figure 9:
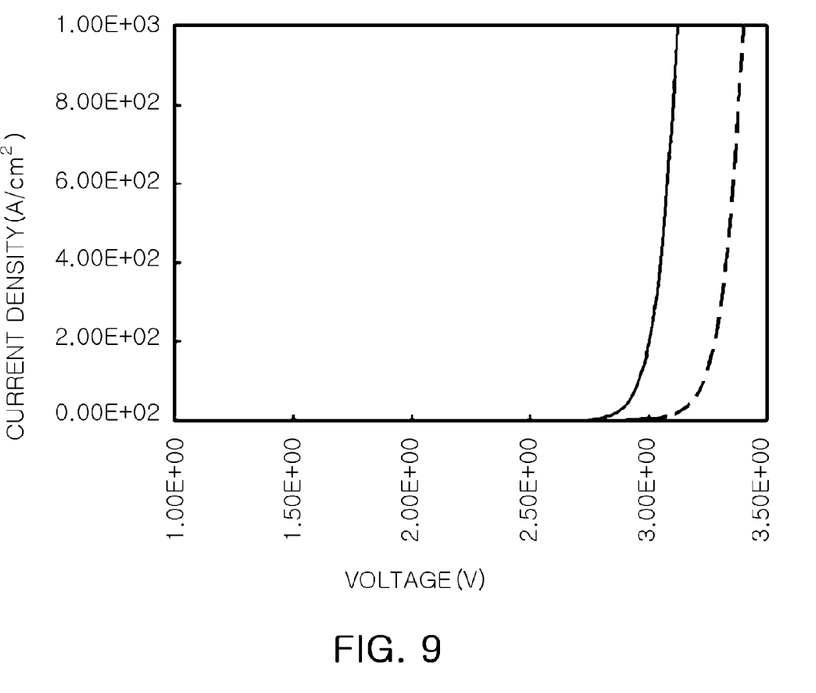
FIG. 9 is a graph showing a comparison between current density over voltage in the semiconductor light emitting device according to an embodiment of the present invention and that of a comparative example.
Figure 10:
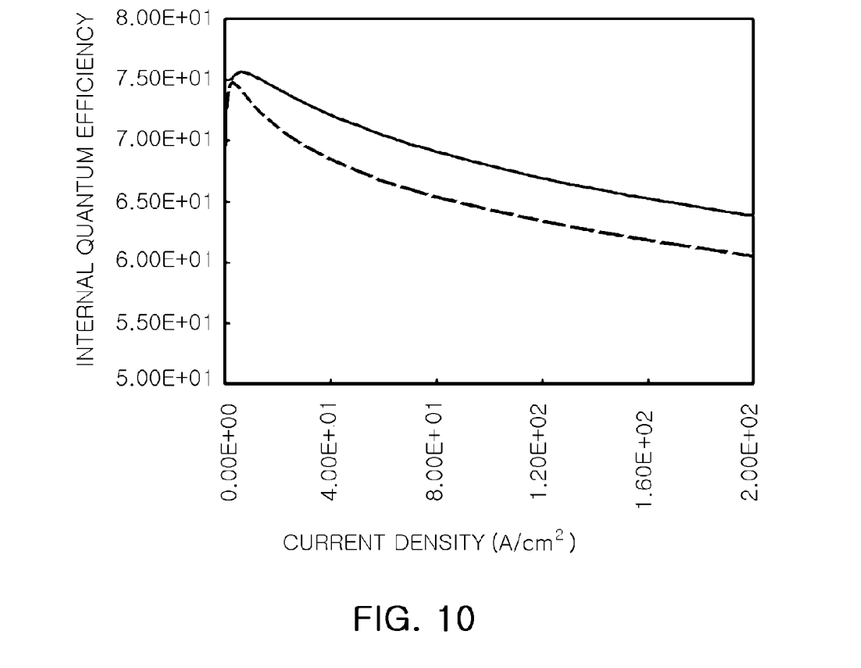
FIG. 10 is a graph showing a comparison between internal quantum efficiency over current density in the semiconductor light emitting device according to an embodiment of the present invention and that of the comparative example.
Figure 11:
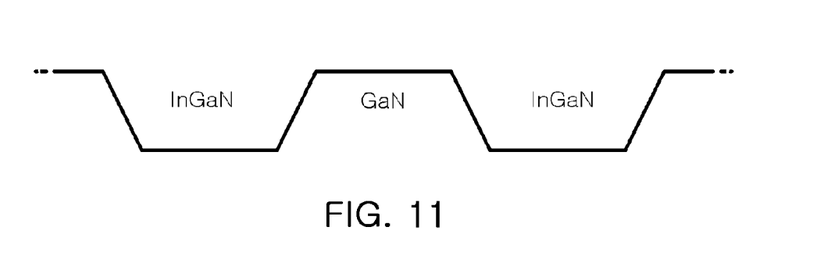
FIG. 11 is a view showing a conduction band energy level in an active layer of the comparative example.

FIG. 9 is a graph showing a comparison between current density over voltage in the semiconductor light emitting device according to an embodiment of the present invention and that of a comparative example. FIG. 10 is a graph showing a comparison between internal quantum efficiency over current density in the semiconductor light emitting device according to an embodiment of the present invention and that of the comparative example. The embodiment (the solid line) of the present invention employed an active layer having the band gap energy structure described above with reference to FIG. 8, and the comparative example employed an active layer having an energy level in the form illustrated in FIG. 11. Namely, in the comparative example, the quantum barrier layer did not include indium (In) and was made of GaN to have uniform band gap energy. With reference to FIG. 9, it can be seen that the driving voltage was reduced in the embodiment of the present invention, and with reference to FIG. 10, it can be seen that internal quantum efficiency in the embodiment was enhanced over the overall current density. It may be understood that the reduction in the driving voltage and the increase in the internal quantum efficiency of the embodiment are due to the reduction in the influence of the polarization charges in the region between the quantum well layer and the quantum barrier layer as described above.

Figure 12:
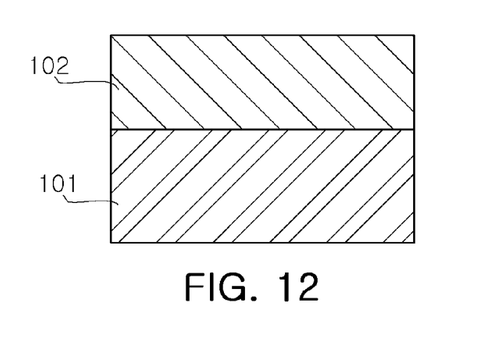
FIGS. 12 through 14 are sectional views sequentially showing a process of a method for fabricating a semiconductor light emitting device according to an embodiment of the present invention.
Figure 13:
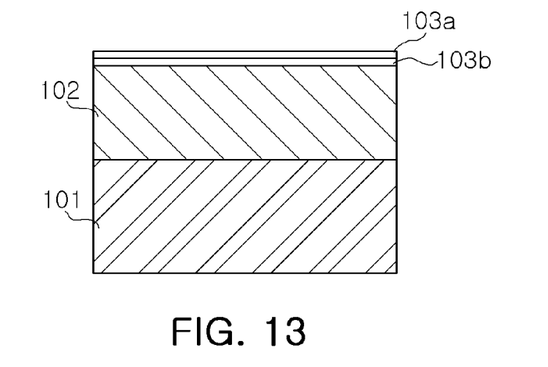
Figure 14:
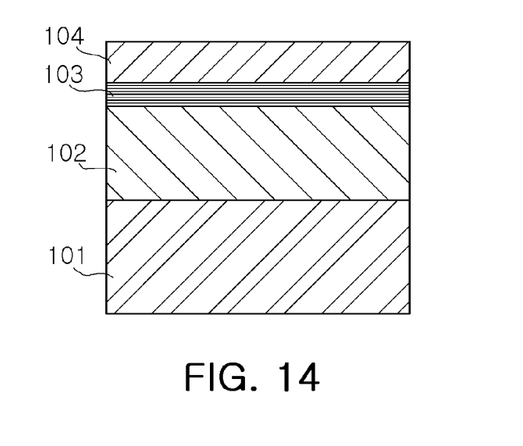

A method for fabricating the semiconductor light emitting device having the foregoing structure will be described. FIGS. 12 through 14 are sectional views sequentially showing a process of a method for fabricating a semiconductor light emitting device according to an embodiment of the present invention.

First, as shown in FIG. 12, the first conductivity-type semiconductor layer 102 is formed on the substrate 101. As the substrate 101, various types of growth substrates, e.g., a sapphire substrate, a silicon (Si) substrate, or the like, may be used. In particular, when a nitride semiconductor is grown from the C face of sapphire, an internal electric field may be generated in the nitride semiconductor due to a piezoelectric effect. The first conductivity-type semiconductor layer 102 may be formed by using a known thin film growing process such as MOCVD, HAPE, or the like. Here, although not shown, before the conductivity-type semiconductor layer 102 is grown, a buffer layer for reducing stress acting on the conductivity-type semiconductor layer 102 to improve crystallinity may be formed on the substrate 101 in advance.

Next, as shown in FIG. 13, the quantum barrier layer 103b and the quantum well layer 103a are alternately grown on the conductivity-type semiconductor layer 102 to form the active layer 103. In this case, formation order of the quantum barrier layer 103b and the quantum well layer 103a are not particularly limited. As described above, the quantum well layer 103a is made of $In_xGa_{(1-x)}N$ ($0 \le x \le 1$), and the quantum barrier layer 103b is made of $Al_yIn_zGa_{(1-y-z)}N$ ($0 \le y \le 1$, $0 \le z < 1$). With respect to the quantum barrier layer 103b, process conditions such as a growth temperature, and the like, may be adjusted such that the content of indium (In) of the quantum barrier layer 103b is reduced and then increased. Namely, with reference to FIG. 2, the first region ① in which the content of indium (In) is reduced may be formed such that indium (In) is volatized by gradually increasing the growth temperature of the quantum barrier layer 103b, and the second region ② may be formed such that volatization of indium (In) is reduced by gradually decreasing the growth temperature of the quantum barrier layer 103b. In a specific example, in the first region ① of the quantum barrier layer 103b, the content of indium (In) may be reduced starting from a composition containing about less than 10% of indium (In), e.g., $In_{0.05}Ga_{0.95}N$ until GaN is formed, and in addition, an Al source gas may be additionally provided to increase band gap energy.

In this case, a growth temperature in the region in which the quantum barrier layer 103b starts to grow, namely, in the region (R1 in FIG. 2) of the first region ① having the highest content of indium (In), may be changed within a range of 650° C. to 900° C., and a growth temperature in the region of the quantum barrier layer 103b in which the band gap energy is the largest, namely, in the region (R2 in FIG. 2) of the first region ① M having the lowest content of indium (In), may be changed within a range of 700° C. to 1,200° C. In a similar manner, the content of indium (In) of the quantum well layer 103a may be adjusted by a growth temperature, and here, a growth temperature of the quantum well layer 103a may be gradually reduced or increased to have the energy level of FIG. 8. In this case, the content of indium (In) of the quantum barrier layer 103b or the quantum well layer 103a may not necessarily be adjusted by the growth temperature; it may also be adjusted by a supply amount of an indium (In) source gas. Namely, the first region ① of the quantum barrier layer 103b may also be formed by gradually reducing the supply amount of an indium (In) source gas such as TMI.

After the active layer 103 is formed, as shown in FIG. 14, the second conductivity-type semiconductor layer 104 is formed on the active layer 103, and thereafter, an ohmic electrode layer, first and second electrodes, and the like, may be formed to complete the structure illustrated in FIG. 1.

As set forth above, according to embodiments of the invention, in the semiconductor light emitting device, crystallinity and internal quantum efficiency can be enhanced while an influence of polarization is minimized through appropriately adjusting the shape of a band gap of a quantum barrier layer and appropriately adjusting a content of indium (In).

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device, comprising:
first and second conductivity-type semiconductor layers; and
an active layer disposed between the first and second conductivity-type semiconductor layers and having a structure in which a quantum barrier layer and a quantum well layer are alternately disposed,
wherein the quantum well layer includes $In_xGa_{(1-x)}N$ ($0 \le x \le 1$) and the quantum barrier layer includes $Al_yIn_zGa_{(1-y-z)}N$ ($0 \le y \le 1$, $0 \le z < 1$),
the quantum barrier layer includes first and second regions disposed in order toward the first conductivity-type semiconductor layer such that no quantum well layer is disposed between the first region and the second region, wherein, in the first region, the content of indium (In) is reduced at a first slope in a direction toward the second conductivity-type semiconductor layer and, in the second region, the content of indium (In) is increased at a second slope in a direction toward the second conductivity-type semiconductor layer, and
the quantum barrier layer includes third and fourth regions interposed between the first and second regions and disposed in order toward the first conductivity-type semiconductor layer, wherein, in the third region, the content of indium (In) is reduced at a third slope that has an absolute value smaller than an absolute value of the first slope, in a direction toward the second conductivity-type semiconductor layer, and in the fourth region, the content of indium (In) is increased at a fourth slope that has an absolute value smaller than an absolute value of the second slope, in the direction toward the second conductivity-type semiconductor layer.

2. The semiconductor light emitting device of claim 1, wherein the third and fourth regions are in contact with each other.

3. The semiconductor light emitting device of claim 1, wherein a region in which the third and fourth regions of the quantum barrier layer are in contact includes GaN.

4. The semiconductor light emitting device of claim 1, wherein absolute values of the first and second slopes are equal.

5. The semiconductor light emitting device of claim 1, wherein a region between the first and second regions in the quantum barrier layer includes GaN.

6. The semiconductor light emitting device of claim 1, wherein the region between the first and second regions in the quantum barrier layer includes $Al_yGa_{(1-y)}N$.

7. The semiconductor light emitting device of claim 1, wherein the quantum barrier layer further includes an intermediate region interposed between the first and second regions and having uniform band gap energy.

8. The semiconductor light emitting device of claim 7, wherein the intermediate region has a thickness ranging from 1 Å to 50 Å.

9. The semiconductor light emitting device of claim 7, wherein the intermediate region includes GaN.

10. The semiconductor light emitting device of claim 7, wherein the intermediate region includes $Al_yGa_{(1-y)}N$.

11. The semiconductor light emitting device of claim 1, wherein a region of the quantum barrier layer forming an interface with at least the quantum well layer includes a material having a composition in which an amount of z is less than or equal to 0.10.

12. The semiconductor light emitting device of claim 1, wherein, in the quantum barrier layer, a band gap shape is symmetrical based on a center between the first and second regions.

13. The semiconductor light emitting device of claim 1, wherein the quantum well layer includes a region in which the content of indium (In) is changed at a slope toward the quantum barrier layer.

14. The semiconductor light emitting device of claim 13, wherein an absolute value of the slope at which the content of indium (In) in the quantum well layer is changed is greater than absolute values of the first and second slopes.

15. The semiconductor light emitting device of claim 1, wherein the active layer has a step structure formed in at least one of regions between the quantum well layer and the quantum barrier layer and having less band gap energy than band gap energy of an adjacent quantum barrier layer.

16. A method for fabricating a semiconductor light emitting device, the method comprising:
    forming a first conductivity-type semiconductor layer on a substrate;
    forming an active layer, having a structure in which a quantum barrier layer and a quantum well layer are alternately disposed, on the first conductivity-type semiconductor layer; and
    forming a second conductivity-type semiconductor layer on the active layer, wherein the quantum well layer includes $In_xGa_{(1-x)}N$ (0<x<1) and the quantum barrier layer includes $Al_yIn_zGa_{(1-y-z)}N$ (0≤y≤1, 0≤z<1), and
    the quantum barrier layer includes first and second regions disposed in order of proximity to the first conductivity-type semiconductor layer such that no quantum well layer is disposed between the first region and the second region, wherein, in the first region, the content of indium (In) is reduced at a first slope in a direction toward the second conductivity-type semiconductor layer and, in the second region, the content of indium (In) is increased at a second slope in a direction toward the second conductivity-type semiconductor layer, and
    the quantum barrier layer includes third and fourth regions interposed between the first and second regions and disposed in order toward the first conductivity-type semiconductor layer, wherein, in the third region, the content of indium (In) is reduced at a third slope that has an absolute value smaller than an absolute value of the first slope, in a direction toward the second conductivity-type semiconductor layer, and in the fourth region, the content of indium (In) is increased at a fourth slope that has an absolute value smaller than an absolute value of the second slope, in the direction toward the second conductivity-type semiconductor layer.

17. The method of claim 16, wherein the forming of an active layer includes forming the first region by gradually increasing a growth temperature of the quantum barrier layer.

18. The method of claim 16, wherein the forming of an active layer includes forming the second region by gradually decreasing the growth temperature of the quantum barrier layer.

19. The method of claim 16, wherein a growth temperature of a region having the highest content of indium (In) in the first region ranges from 650° C. to 900° C.

20. The method of claim 16, wherein a growth temperature of a region having the lowest content of indium (In) in the first region ranges from 700° C. to 1,200° C.

21. The method of claim 16, wherein the content of indium (In) of the first and second regions is adjusted by changing a supply amount of an indium (In) source gas.

22. The method of claim 16, wherein the quantum barrier layer is made of a compound including aluminum (Al), and the content of aluminum (Al) of the quantum barrier layer is adjusted by changing a supply amount of an aluminum (Al) source gas.

* * * * *